US006794100B2

(12) United States Patent
Boettiger et al.

(10) Patent No.: US 6,794,100 B2
(45) Date of Patent: Sep. 21, 2004

(54) METHOD FOR CONTROLLING RADIATION BEAM INTENSITY DIRECTED TO MICROLITHOGRAPHIC SUBSTRATES

(75) Inventors: Ulrich C. Boettiger, Boise, ID (US); Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 09/945,316

(22) Filed: Aug. 30, 2001

(65) Prior Publication Data

US 2003/0044701 A1 Mar. 6, 2003

(51) Int. Cl.$^7$ .............................. G03F 9/00; G03C 5/00

(52) U.S. Cl. ......................... 430/30; 430/296; 430/942

(58) Field of Search ............................ 430/5, 30, 296, 430/942

(56) References Cited

U.S. PATENT DOCUMENTS

| | | | |
|---|---|---|---|
| 4,988,188 A | 1/1991 | Ohta | 353/122 |
| 5,142,132 A | 8/1992 | MacDonald et al. | 250/201.9 |
| 5,194,893 A | 3/1993 | Nishi | 355/53 |
| 5,300,971 A | 4/1994 | Kudo | 355/67 |
| 5,436,464 A | 7/1995 | Hayano et al. | 250/559.01 |
| 5,602,620 A | 2/1997 | Miyazaki et al. | 355/53 |
| 5,631,721 A | 5/1997 | Stanton et al. | |
| 5,661,546 A | 8/1997 | Taniguchi | |
| 5,684,566 A | 11/1997 | Stanton | 355/67 |
| 5,721,608 A | 2/1998 | Taniguchi | |
| 5,796,467 A | 8/1998 | Suzuki | |
| 5,907,392 A | 5/1999 | Makinouchi | 355/53 |
| 5,969,800 A | 10/1999 | Makinouchi | 355/53 |
| 6,084,244 A | 7/2000 | Saiki et al. | 250/548 |
| 6,188,464 B1 | 2/2001 | Makinouchi | 355/53 |
| 6,215,578 B1 | 4/2001 | Lin | |
| 6,251,550 B1 * | 6/2001 | Ishikawa | 430/22 |
| 6,259,513 B1 | 7/2001 | Gallatin et al. | |
| 6,285,440 B1 | 9/2001 | Takahashi | 355/67 |
| 6,291,110 B1 * | 9/2001 | Cooper et al. | 430/5 |
| 6,379,867 B1 * | 4/2002 | Mei et al. | 430/296 |
| 6,392,740 B1 | 5/2002 | Shiraishi et al. | 355/53 |

FOREIGN PATENT DOCUMENTS

JP      11231234      8/1999

OTHER PUBLICATIONS

Optics.org, Industry News, "Micronic and Fraunhofer Develop New Pattern Generators," Posted: Dec. 10, 1999, (1 page).
Fukuda, H. et al., "Improvement of defocus tolerance in a half–micron optical lithography by the focus latitude enhancement exposure method: Simulation and experiment," J. Vac. Sci. Technol B. vol. 7 No. 4, Jul./Aug. 1989, pp. 667–674, 8 pages.

Texas Instruments Incorporated, "What the Industry Experts Say About Texas Instruments Digital MicroMirror Display (DMD) Technology," 6/94, (2 pages).

Hamamatsu Photonics K.K., "PPM—Programmable Phase Modulator," 4 pages, Sep. 2000, <http://www.hamamatsu-.com>.

CRL Opto Limited, LCS2–G Datasheet, 4 pages, 2002, <http://www.crlopto.com/products/datasheets/files/LCS2–datasheet.pdf>.

Boulder Nonlinear Systems, "Liquid Crystal Rotators—Ferroelectric and Nematic," 2 pages, <http://www/bnonlinear.com/papers/rotators.pdf>.

Boulder Nonlinear Systems, "Liquid Crystal Shutters/Variable Optical Attenuaters—Ferroelectric and Nematic," 2 pages, <http://www.bnonlinear.com/papers/shutters.pdf>.

Boulder Nonlinear System, "512x512 Multi–level/Analog Liquid Crystal Spatial Light Modulator," 2 pages, <http://www.bnonlinear.com/papers/512SLM.pdf>.

Boulder Nonlinear Systems, "256x256 Multi–level/Analog Liquid Crystal Spatial Light Modulator," 2 pages, <http://www.bnonlinear.com/papers/256SLM.pdf>.

Digital Optics Corporation, "Pattern Generators," 1 page, 2002, retrieved from the Internet on Jul. 30, 2003, <http://www.digitaloptics.com/products_ind.asp?pid=55>.

Micro–Optics, Inc., "Polarzation Maintaining Faraday Rotator (PMFR)," 1 page, retrieved from the Internet on Jul. 30, 2003, <http://www.microopticsinc.com/PMFR.html>.

Farsari, M. et al., "Microfabrication by use of a spatial light modulator in the ultraviolet: experimental results," Optics Letters, vol. 24, No. 8, pp. 549–550, Apr. 15, 1999, Optical Society Of America, Washington, DC.

* cited by examiner

Primary Examiner—Christopher G. Young
(74) Attorney, Agent, or Firm—Perkins Coie LLP

(57) ABSTRACT

A method and apparatus for controlling an intensity distribution of a radiation beam directed to a microlithographic substrate. The method can include directing a radiation beam from a radiation source along the radiation path, with the radiation beam having a first distribution of intensity as the function of location in a plane generally transverse to the radiation path. The radiation beam impinges on an adaptive structure positioned in the radiation path and an intensity distribution of the radiation beam is changed from the first distribution to a second distribution by changing a state of the first portion of the adaptive structure relative to a second portion of the adaptive structure. For example, the transmissivity of the first portion, or inclination of the first portion can be changed relative to the second portion. The radiation is then directed away from the adaptive structure to impinge on the microlithographic substrate.

40 Claims, 6 Drawing Sheets

METHOD FOR CONTROLLING RADIATION BEAM INTENSITY DIRECTED TO MICROLITHOGRAPHIC SUBSTRATES

CROSS-REFERENCE TO RELATED APPLICATION

This application relates to material disclosed in U.S. application Ser. No. 09/945,167 titled "Method and Apparatus for Irradiating a Microlithographic Substrate," filed on Aug. 30, 2001 and incorporated herein in its entirety by reference.

BACKGROUND

The present invention is directed toward methods and apparatuses for controlling the intensity of a radiation beam directed toward a microlithographic substrate. Microelectronic features are typically formed in microelectronic substrates (such as semiconductor wafers) by selectively removing material from the wafer and filling in the resulting openings with insulative, semiconductive, or conductive materials. One typical process includes depositing a layer of radiation-sensitive photoresist material on the wafer, then positioning a patterned mask or reticle over the photoresist layer, and then exposing the masked photoresist layer to a selected radiation. The wafer is then exposed to a developer, such as an aqueous base or a solvent. In one case, the photoresist layer is initially generally soluble in the developer, and the portions of the photoresist layer exposed to the radiation through patterned openings in the mask change from being generally soluble to become generally resistant to the developer (e.g., so as to have low solubility). Alternatively, the photoresist layer can be initially generally insoluble in the developer, and the portions of the photoresist layer exposed to the radiation through the openings in the mask become more soluble. In either case, the portions of the photoresist layer that are resistant to the developer remain on the wafer, and the rest of the photoresist layer is removed by the developer to expose the wafer material below.

The wafer is then subjected to etching or metal disposition processes. In an etching process, the etchant removes exposed material, but not material protected beneath the remaining portions of the photoresist layer. Accordingly, the etchant creates a pattern of openings (such as grooves, channels, or holes) in the wafer material or in materials deposited on the wafer. These openings can be filled with insulative, conductive, or semiconductive materials to build layers of microelectronic features on the wafer. The wafer is then singulated to form individual chips, which can be incorporated into a wide variety of electronic products, such as computers and other consumer or industrial electronic devices.

As the size of the microelectronic features formed in the wafer decreases (for example, to reduce the size of the chips placed in electronic devices), the size of the features formed in the photoresist layer must also decrease. In some processes, the dimensions (referred to as critical dimensions) of selected features are evaluated as a diagnostic measure to determine whether the dimensions of other features comply with manufacturing specifications. Critical dimensions are accordingly selected to be the most likely to suffer from errors resulting from any of a number of aspects of the foregoing process. Such errors can include errors generated by the radiation source and/or the optics between the radiation source and the mask. The errors can also be generated by the mask, by differences between masks, and/or by errors in the etch process. The critical dimensions can also be affected by errors in processes occurring prior to or during the exposure/development process, and/or subsequent to the etching process, such as variations in deposition processes, and/or variations in material removal processes, such as chemical-mechanical planarization processes.

One general approach to correcting lens aberrations in wafer optic systems (disclosed in U.S. Pat. No. 5,142,132 to McDonald et al.) is to reflect the incident radiation from a deformable mirror, which can be adjusted to correct for the aberrations in the lens optics. However, correcting lens aberrations will not generally be adequate to address the additional factors (described above) that can adversely affect critical dimensions. Accordingly, another approach to addressing some of the foregoing variations and errors is to interpose a gradient filter between the radiation source and the mask to spatially adjust the intensity of the radiation striking the wafer. Alternatively, a thin film or pellicle can be disposed over the mask to alter the intensity of light transmitted through the mask. In either case, the filter and/or the pellicle can account for variations between masks by decreasing the radiation intensity incident on one portion of the mask relative to the radiation intensity incident on another.

One drawback with the foregoing arrangement is that it may be difficult and/or time-consuming to change the gradient filter and/or the pellicle when the mask is changed. A further drawback is that the gradient filter and the pellicle cannot account for new errors and/or changes in the errors introduced into the system as the system ages or otherwise changes.

SUMMARY

The present invention is directed to methods and apparatuses for controlling the intensity distribution of radiation directed to microlithographic substrates. In one aspect of the invention, the method can include directing a radiation beam from a radiation source along radiation path, with the radiation beam having a first distribution of intensity as a function of location in a plane generally transverse to the radiation path. The method can further include impinging the radiation beam on an adaptive structure positioned in the radiation path, and changing an intensity distribution of the radiation beam from the first distribution to a second distribution different than the first distribution by changing a state of a first portion of the adaptive structure relative to a second portion of the adaptive structure. The method can further include directing the radiation beam away from the adaptive structure along the radiation path and impinging the radiation beam directed away from the adaptive structure on the microlithographic substrate.

In a further aspect of the invention, the method can include impinging a first portion of the radiation beam on a first portion of a reflective medium and impinging a second portion of the radiation beam on a second portion of the reflective medium. The method can further include moving the first portion of the reflective medium relative to the second portion, and reflecting at least part of the first portion of the radiation beam toward a first portion of a grating having a first transmissivity, and reflecting at least part of the second portion of the radiation beam toward a second portion of the grating having a second transmissivity greater than the first transmissivity. At least part of the second portion of the radiation beam then passes through the grating to impinge on the microlithographic substrate, while at least part of the first portion of the radiation beam is attenuated or blocked from passing through the grating.

The invention is also directed toward an apparatus for controlling an intensity distribution of radiation directed to a microlithographic substrate. The apparatus can include a substrate support having a support surface positioned to carry a microlithographic substrate, and a source of radiation positioned to direct a radiation beam along a radiation path toward the substrate support. The apparatus can further include an adaptive structure positioned in the radiation path and configured to receive the radiation beam with a first intensity distribution and transmit the radiation beam with a second intensity distribution different than the first intensity distribution. The adaptive structure can have a first portion and a second portion, each positioned to receive the radiation and changeable from a first state to a second state, wherein the adaptive structure is configured to transmit the radiation with the second intensity distribution when the first portion is in the first state and the second portion is in the second state. The apparatus can further include a controller operatively coupled to the adaptive structure to direct at least one of the first and second portions to change from the first state to the second state to change an intensity distribution of the radiation beam from the first intensity distribution to the second intensity distribution.

In a further aspect of the invention, the adaptive structure can include a selectively transmissive medium having a first portion aligned with a first portion of the radiation beam when the radiation beam is emitted from the radiation source, and a second portion aligned with the second portion of the radiation beam. Each of the first and second portions can have a transmissivity that is changeable from a first transmissivity to a second transmissivity different than the first transmissivity. Alternatively, the adaptive structure can include a reflective medium having a first portion aligned with a first portion of the radiation beam when the radiation beam is emitted from the radiation source, and a second portion aligned with a second portion of the radiation beam. Each of the first and second portions of the reflective medium can be coupled to at least one actuator to move from a first inclination angle relative to the radiation path to a second inclination angle relative to the radiation path, with the second inclination angle being different than the first inclination angle.

DETAILED DESCRIPTION

The present disclosure describes methods and apparatuses for controlling the intensity of radiation directed toward a microlithographic substrate. The term "microlithographic substrate" is used throughout to include substrates upon which and/or in which microelectronic circuits or components, data storage elements or layers, vias or conductive lines, micro-optic features, micromechanical features, and/or microbiological features are or can be fabricated using microlithographic techniques. Many specific details of certain embodiments of the invention are set forth in the following description and in FIGS. 1–6C to provide a thorough understanding of these embodiments. One skilled in the art, however, will understand that the present invention may have additional embodiments, and that the invention may be practiced without several of the details described below.

Figure 1:
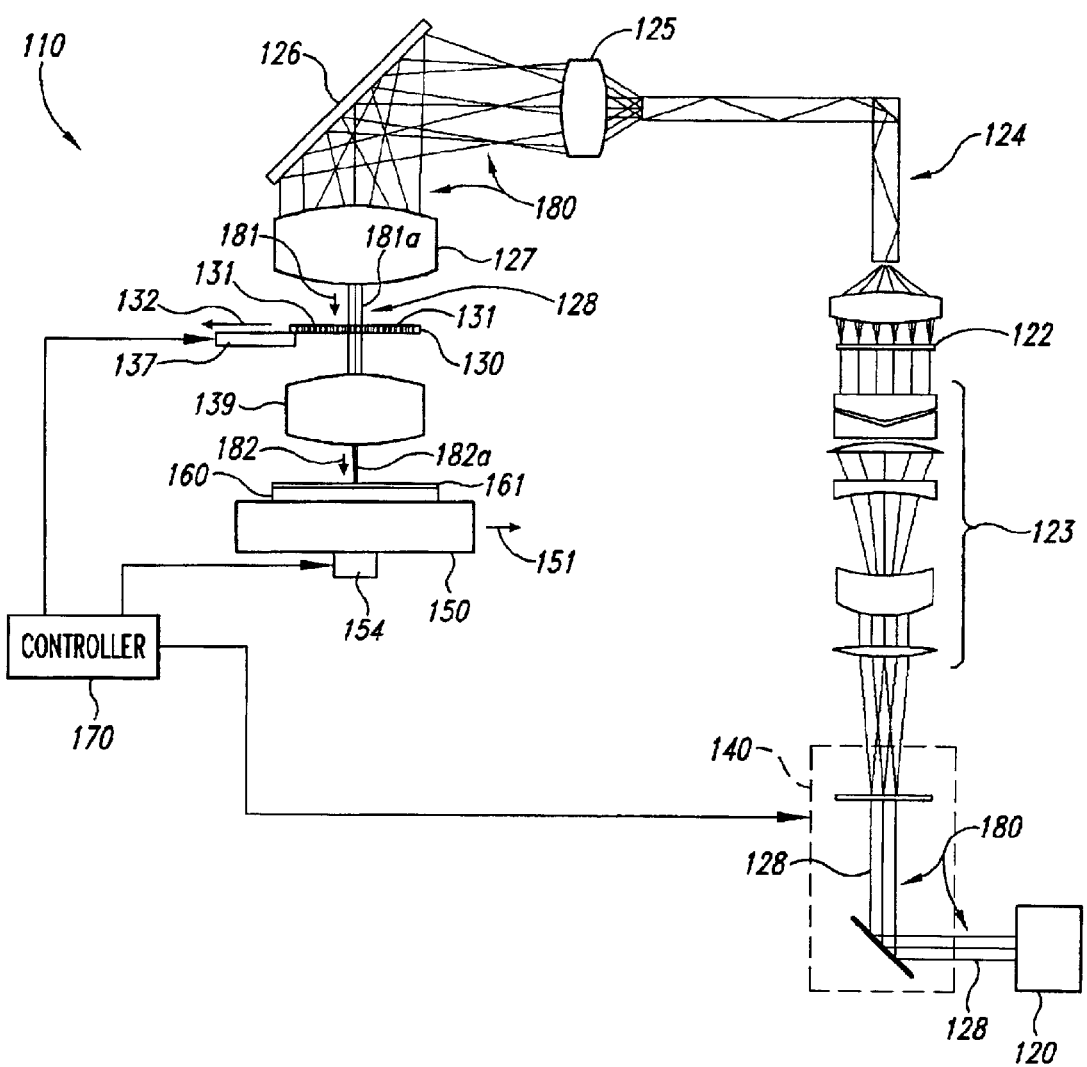
FIG. 1 is a partially schematic view of an apparatus for irradiating microlithographic substrates in accordance with an embodiment of the invention.

FIG. 1 schematically illustrates an apparatus 110 for controllably irradiating a microlithographic substrate 160 in accordance with an embodiment of the invention. The apparatus 110 can include a radiation source 120 that directs an electromagnetic radiation beam 128 along a radiation path 180 toward the microlithographic substrate 160. The apparatus 110 can further include an adaptive structure 140 that adjusts the intensity distribution of the incoming radiation beam 128. Optionally, the radiation beam 128 can then pass through a lens system 123 configured to shape and/or magnify the radiation emitted by the source 120. Optionally, the apparatus 110 can further include a diffractive element 122 to diffuse the radiation, and a light tube 124 positioned to generate a plurality of images of the radiation source 120. The light tube 124 and/or or a sizing lens 125 can size the radiation beam 128, which can then be directed by a mirror 126 through a focusing lens 127 to a reticle or mask 130 along a reticle radiation path segment 181a.

The reticle 130 can include reticle apertures 131 through which the radiation passes to form an image on the microlithographic substrate 160. The radiation passes through a reduction lens 139 which reduces the image pattern defined by the reticle to a size corresponding to the size of the features to be formed on the microlithographic substrate 160. The radiation beam 128 then travels in a second direction 182 along a substrate radiation path segment 182a, and impinges on a radiation-sensitive material (such as a photoresist layer 161) of the microlithographic substrate 160 to form an image on the layer 161. In one embodiment, the beam 128 impinging on the layer 161 can have a generally rectangular shape with a width of from about 5 mm. to about 8 mm. and a length of about 26 mm. In other embodiments, the beam 128 incident on the layer 161 can have other shapes and sizes. In one embodiment, the radiation can have a wavelength in the range of about 157 nanometers or less (for example, 13 nanometers) to a value of about 365 nanometers or more. For example, the radiation can have a wavelength of about 193 nanometers. In other embodiments, the radiation can have other wavelengths suitable for exposing the layer 161 on the microlithographic substrate 160.

The microlithographic substrate 160 is supported on a substrate support 150. In one embodiment (a scanner arrangement), the substrate support 150 moves along a substrate support path 151, and the reticle 130 moves in the opposite direction along a reticle path 132 to scan the image produced by the reticle 130 across the layer 161 while the position of the radiation beam 128 remains fixed. Accordingly, the substrate support 150 can be coupled to a support actuator 154 and the reticle 130 can be coupled to a reticle actuator 137.

As the reticle 130 moves opposite the microlithographic substrate 160, the radiation source 120 can flash to irradiate successive portions of the microlithographic substrate 160 with corresponding successive images produced by the reticle 130, until an entire field of the microlithographic substrate 160 is scanned. In one embodiment, the radiation source 120 can flash at a rate of about 20 cycles during the time required for the microlithographic substrate 160 to move by one beam width (e.g., by from about 5 mm. to about 8 mm.). In other embodiments, the radiation source 120 can flash at other rates. In any of these embodiments, the radiation source 120 can flash at the same rate throughout the scanning process (assuming the reticle 130 and the substrate 150 each move at a constant rate) to uniformly irradiate each field. Alternatively, the radiation source 120 can deliver a continuous radiation beam 128. In either embodiment, each field can include one or more dice or chips, and in other embodiments, each field can include other features.

In another embodiment (a stepper arrangement), the radiation beam 128 and the reticle 130 can expose an entire field of the microlithographic substrate 160 in one or more flashes, while the reticle 130 and the substrate support 150 remain in a fixed transverse position relative to the radiation path 180. After the field has been exposed, the reticle 130 and/or substrate support 150 can be moved transverse to the radiation path 180 to align other fields with the radiation beam 128. This process can be repeated until each of the fields of the microlithographic substrate 160 is exposed to the radiation beam 128. Suitable scanner and stepper devices are available from ASML of Veldhoven, The Netherlands; Canon USA, Inc., of Lake Success, N.Y.; and Nikon, Inc. of Tokyo, Japan.

In a further aspect of this embodiment, a controller 170 is operatively coupled to the reticle 130 (or the reticle actuator 137) and the substrate support 150 (or the support actuator 154). Accordingly, the controller 170 can include a processor, microprocessor or other device that can automatically (with or without user input) control and coordinate the relative movement between these elements. The controller 170 can also be coupled to the adaptive structure 140 to control the intensity distribution of the radiation beam 128, as described in greater detail below.

Figure 2:
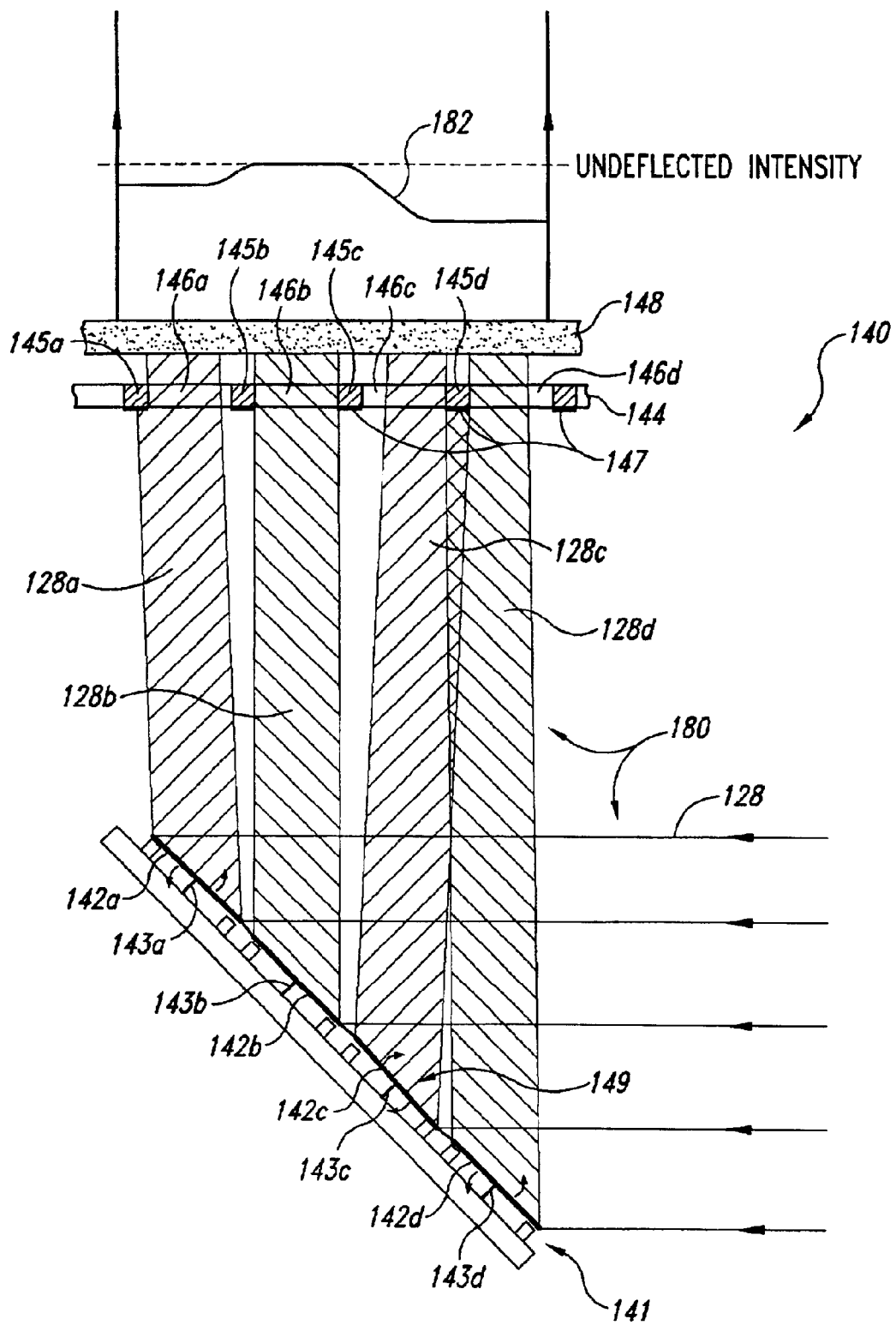
FIG. 2 is a partially schematic view of a portion of an adaptive structure that includes a reflective medium and a diffuser plate in accordance with an embodiment of the invention.

FIG. 2 is a schematic view of the adaptive structure 140 described above with reference to FIG. 1 in accordance with an embodiment of the invention. In one aspect of this embodiment, the adaptive structure 140 can include a reflective medium 141, a grating 144, and a diffuser 148, all positioned along the radiation path 180. The reflective medium 141 can include a two-dimensional array of movable reflective elements 142 (four of which are shown schematically in FIG. 2 as elements 142a–d), coupled to a corresponding plurality of actuators 143 (shown as actuators 143a–d). For example, the reflective medium 141 can include a digital multi-mirror device, such as a device available from Texas Instruments of Dallas, Tex. Accordingly, each reflective element 142 can form a portion of a larger reflective surface 149 and can move independently of the other reflective elements. The interstices between the reflective elements 146 can be filled with a reflective (or optionally, a non-reflective) material that allows for relative movement of adjacent elements 142.

The reflective elements 142 direct the radiation beam 128 to the grating 144. In one embodiment, the grating 144 can include first portions or regions 145 (shown as first regions 145a–d) positioned between second portions or regions 146 (shown as second regions 146a–d). In one embodiment, the first regions 145 can be opaque and the second regions 146 can be transparent. In other embodiments, the first and second regions 145, 146 can have other transmissivities for which a first transmissivity of the first regions 145 is less than a second transmissivity of the second regions 146. In one embodiment, the first regions 145 can be formed by a rectilinear grid of lines disposed on an otherwise transparent (or at least more transmissive) substrate, such as quartz. In other embodiments, the first regions 145 can have other shapes and arrangements. In any of these embodiments, the first regions 145 can intersect some of the radiation directed by the reflective medium 141 toward the grating 144 to locally reduce the intensity of the radiation passing through the grating 144. In a further aspect of this embodiment, the first regions 145 can have an absorptive coating 147 facing toward the reflective medium 141 to prevent the intersected radiation from reflecting back toward the reflective medium 141.

The diffuser 148 receives the radiation passing through the grating 144 and smoothes what might otherwise be discrete shadows or discontinuities in the intensity distribution produced by the first regions 145 of the grating 144. Accordingly, the diffuser 148 can produce an intensity distribution represented schematically in FIG. 2 by line 182 and described in greater detail below.

In operation, each of the reflective elements 142 of the reflective medium 141 can be positioned to direct portions of the impinging radiation beam 128 (which has an initial, generally uniform intensity distribution across the section of the beam) in a selected manner to produce a different intensity distribution. For example, element 142b can be positioned to direct a radiation beamlet 128b directly between two first regions 145b and 145c to produce an undeflected level of intensity, as indicated by line 182. Elements 142c and 142d can be positioned to direct radiation beamlets 128c and 128d, respectively, directly toward first region 145d. Accordingly, the radiation reflected by these elements will have a reduced intensity, as is also shown by line 182. The reflective element 142a can be positioned to direct a radiation beamlet 128a that illuminates less than the entire corresponding first region 145a to produce a level of intensity that is less than that produced by element 142b, but greater than that produced by elements 142c and 142d. Similar adjustments can be made to the entire array of reflective elements 142 to selectively tailor the intensity distribution to a selected level.

In one embodiment, the resolution of the changes in intensity distribution shown in FIG. 2 can be relatively coarse in comparison to the individual features produced on the microlithographic substrate 160 (FIG. 1). For example, the microelectronic or other microlithographic features formed in the microlithographic substrate 160 can have dimensions on the order of less than one micron, while the distance between adjacent portions of the radiation beam 128 having different intensities can be from about 0.3 mm. to about 1 mm. or greater. In one embodiment, the shift in intensity can be less than about 10% of the undeflected intensity of the radiation beam 128 (e.g., less than about 10% of the intensity incident on the reflective medium 141). In other embodiments, the maximum deviation in intensity from any portion of the radiation beam 128 to any other portion can be less than about 5% of the incident intensity, and in a specific embodiment, can be from about 1% to about 2% of the incident intensity. Accordingly, the grating 144 can have an open area of about 90 percent in one embodiment, and can have a greater open area in other embodiments.

Figure 3:
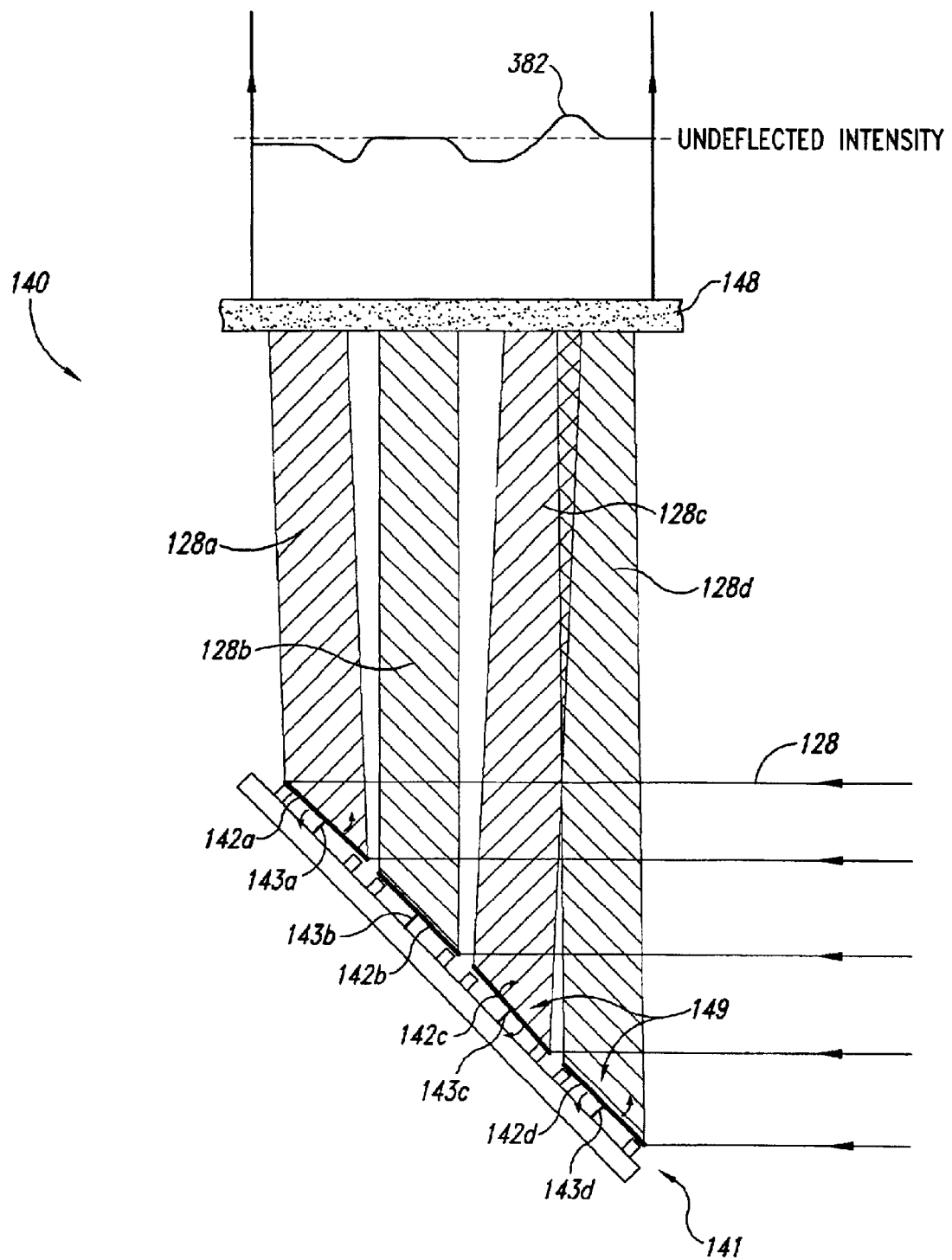
FIG. 3 is a partially schematic view of an adaptive structure that includes a reflective medium and a diffuser plate in accordance with another embodiment of the invention.

FIG. 3 is a partially schematic illustration of another embodiment of the adaptive structure 140 described above with reference to FIG. 2. In one aspect of this embodiment, the adaptive structure 140 does not include a grating 144. Accordingly, the reflective elements 142a–d can direct corresponding radiation beamlets 128a–d at different angles directly to the diffuser 148. The diffuser 148 can smooth out transitions between regions of the radiation beam 128 having different intensities (generally as described above) to produce a radiation distribution line 382. In one aspect of this embodiment, the radiation beamlets 128c and 128d can combine to produce a local intensity greater than the undeflected intensity. One advantage of the arrangement shown in FIG. 3 when compared to the arrangement shown in FIG. 2 is that the overall intensity of the radiation beam shown in FIG. 3 can be greater than that shown in FIG. 2 because the grating 144 (which can absorb a portion of the radiation) is eliminated. Conversely, an advantage of the arrangement shown in FIG. 2 is that the grating 144 can provide an added degree of control over the reflected radiation beam 128 (for example, it may dampen the effect of system vibrations), when compared to an arrangement that includes the diffuser 148 alone.

Figure 4:
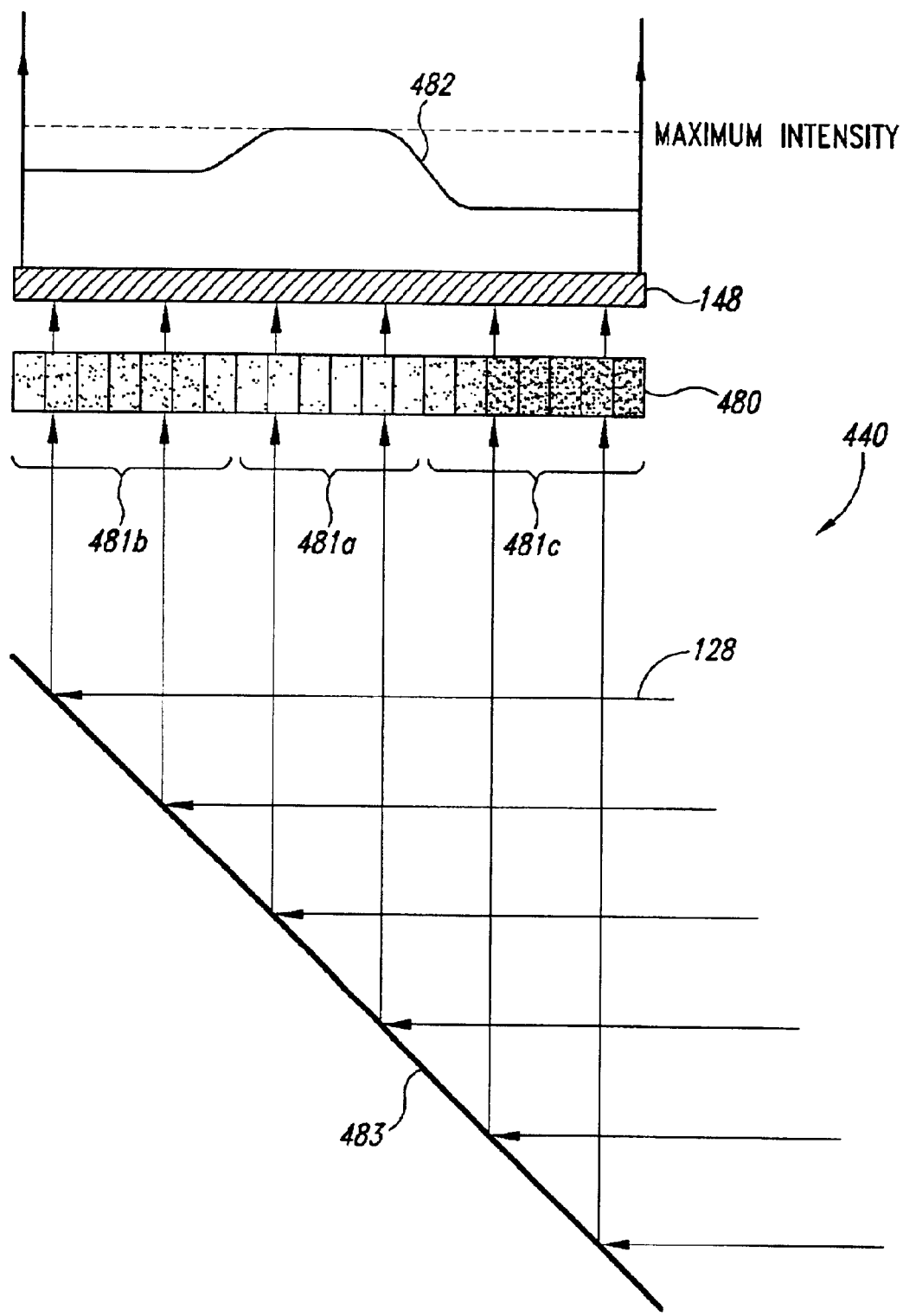
FIG. 4 is a partially schematic view of an adaptive structure that includes a selectively transmissive medium in accordance with yet another embodiment of the invention.

FIG. 4 is a partially schematic illustration of an adaptive structure 440 having a mirror 483 that directs the radiation beam 128 to impinge on a variably transmissive medium 480. The variably transmissive medium 480 can include a liquid crystal material arranged to form variably transmissive elements 481 (shown in FIG. 4 as elements 481a–c). The variably transmissive elements 481 can be coupled to a source of electrical power and can be reversibly changed from one transmissive state to another, within a range of transmissivities that can vary from transparent or nearly transparent to opaque or nearly opaque. For example, the variably transmissive elements 481 a can be selected to be transparent or at least approximately transparent to pass a portion of the radiation beam 128 through the variably transmissive medium 480 at a high level of intensity, as shown by intensity line 482. The variably transmissive elements 481b can have a lower transmissivity to reduce the intensity of a corresponding portion of the radiation beam 128. The variably transmissive elements 481c can have a transmissivity lower than that of the elements 481b to further reduce the intensity of a corresponding portion of the radiation beam 128. In other embodiments, the states of the variably transmissive elements 481 can be changed in other manners to produce any of a wide variety of intensity distributions in the radiation beam 128.

In other embodiments, the adaptive structure 440 can have other arrangements. For example, the variably transmissive medium 480 can include materials other than a liquid crystal material. In another alternate embodiment, the variably transmissive medium can include a single, continuously variable element in place of the plurality of elements described above. In any of the foregoing embodiments, the adaptive structure 440 can adjust the intensity of the radiation beam to the levels and resolutions described above with reference to FIG. 2.

Figures 5, 6A:
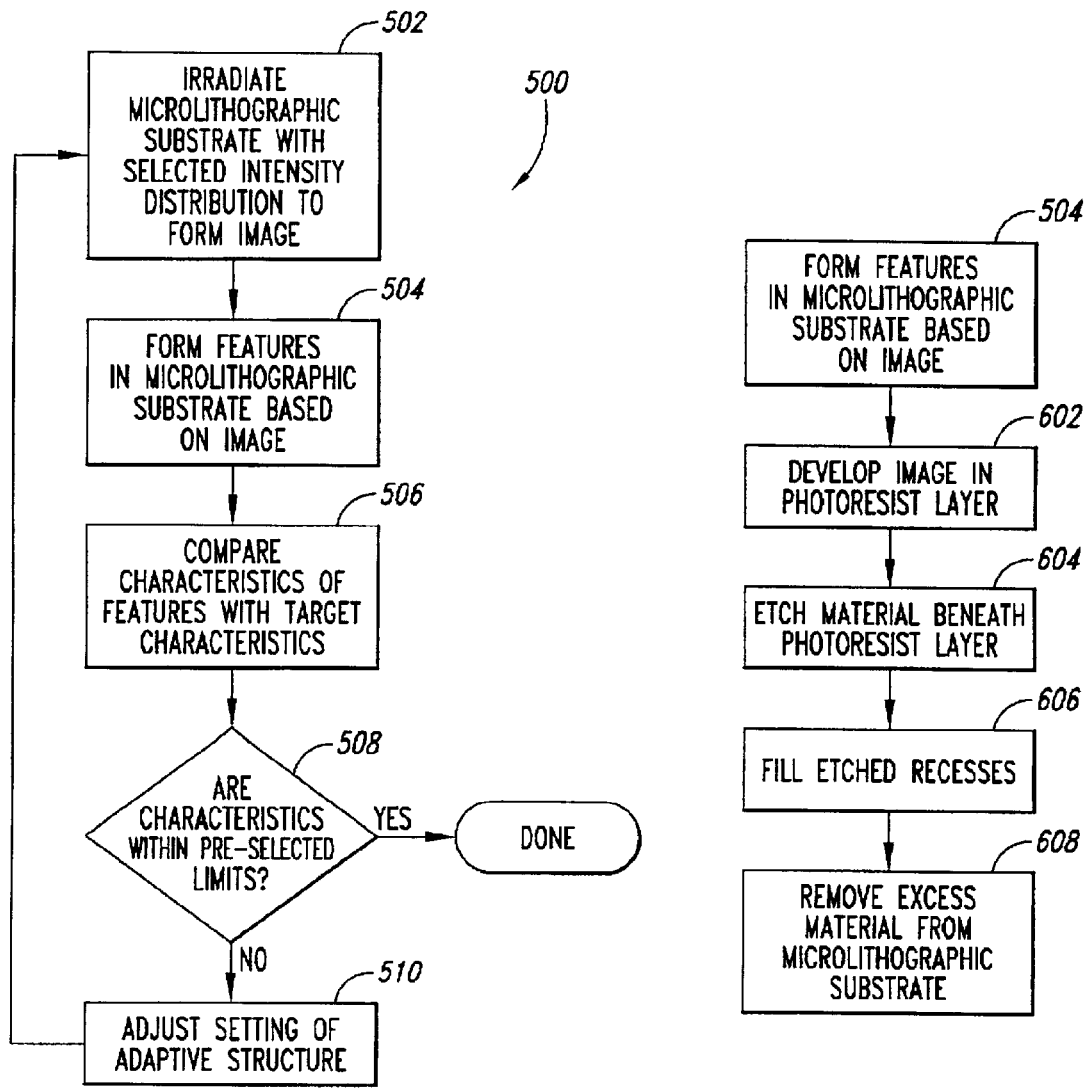
FIG. 5 is a flow chart illustrating a method for adjusting characteristics of radiation directed toward a microlithographic substrate in accordance with an embodiment of the invention.
FIGS. 6A–6C are flow diagrams illustrating details of methods for adjusting the radiation directed toward microlithographic substrates in accordance with further embodiments of the invention.
Figure 6B:
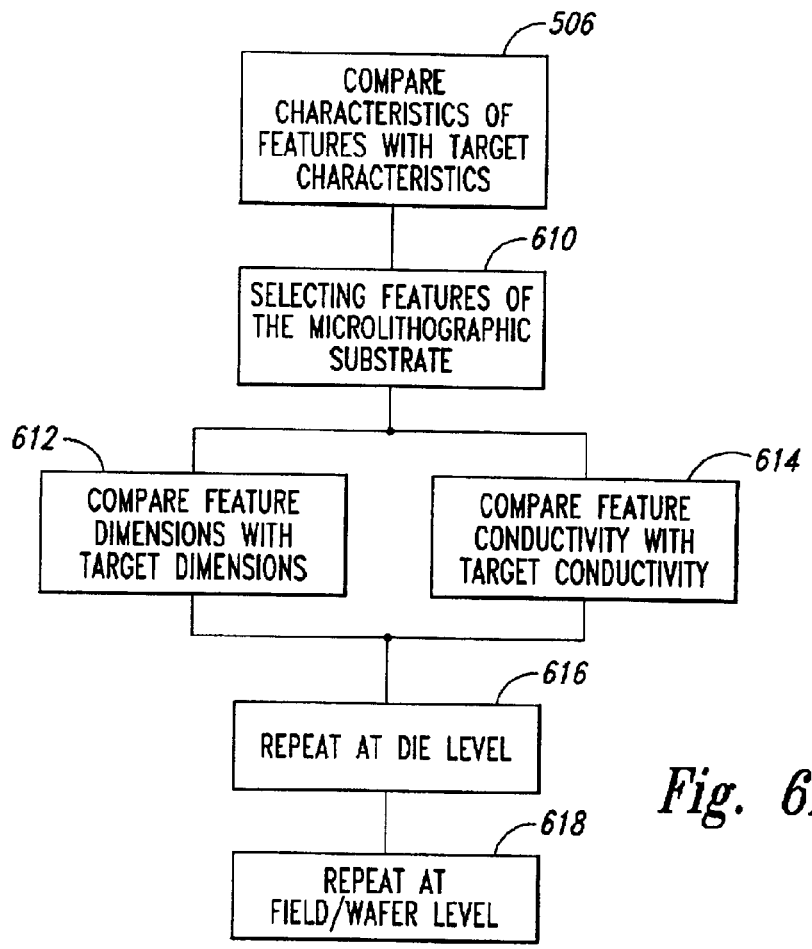
Figure 6C:
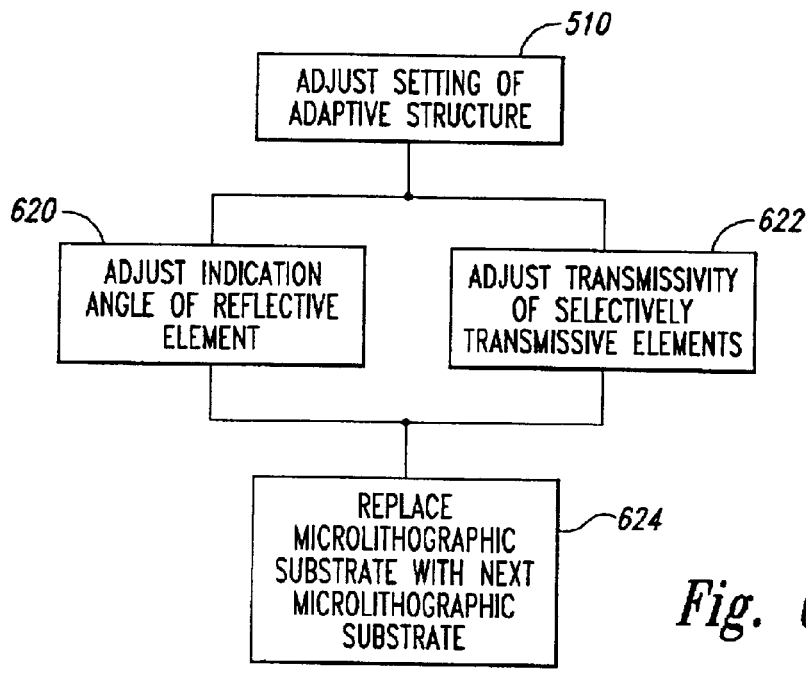

FIG. 5 is a flow diagram illustrating steps of a method for using any of the apparatuses described above with reference to FIGS. 1–4 in accordance with an embodiment of the invention. FIGS. 6A–6C illustrate further details of the steps shown in FIG. 5. Beginning with FIG. 5, a method 500 can include irradiating a microlithographic substrate with a radiation beam having a selected intensity distribution to form an image on the microlithographic substrate (step 502). The method can further include forming features in the microlithographic substrate based on the image formed in step 502 (step 504). In step 506, characteristics of the features formed in the microlithographic substrate are compared with target characteristics. In step 508, the process includes determining whether the characteristics of the features are within pre-selected limits. If the characteristics are within the limits, the process ends. If not, the configuration or setting of the adaptive structure is adjusted in step 510, and the process is repeated with a different microlithographic substrate.

FIG. 6A illustrates details of an embodiment of the process for forming features in the microlithographic substrate based on the image formed with the radiation beam (step 504). In one aspect of this embodiment, the process can further include developing the image in a photoresist layer (step 602). The material beneath the photoresist layer can be selectively etched to form recesses (step 604). The recesses can be filled with a conductive, semiconductive, or non-conductive material (step 606). Once the recesses have been filled, excess material can be removed from the microlithographic substrate, for example, by chemical-mechanical planarization, in step 608.

FIG. 6B illustrates further details of embodiments of the process for comparing characteristics of features in the microlithographic substrate with target characteristics (step 506). In step 610, the process can include selecting the features of the microlithographic substrate. For example, the features can include control structures specifically formed in the microlithographic substrate for diagnostic purposes. Alternatively, the process can include selecting other structures of the microlithographic substrate, such as features configured to be operated by the end user. In still a further embodiment, the features can include features formed in a photoresist layer prior to etching or depositing materials on the microlithographic substrate. In any of these embodiments, the process can include comparing measured feature dimensions with target values for the same dimensions (step 612). In a specific aspect of this process, the method can include analyzing the features with an electron microscope and comparing the measured results with target results. In another embodiment (step 614), the method can include comparing the conductivity of one or more features with a target conductivity. In any of the foregoing embodiments, the process of comparing characteristics of microelectronic or other microlithographic features with target characteristics can be repeated until an entire die is checked (step 616) and/or until an entire field and/or wafer is checked (step 618). The process can also be carried out on a plurality of wafers or other microlithographic substrates.

FIG. 6C illustrates details of an embodiment of the process of adjusting the setting of the adaptive structure (step 510). For example, when the adaptive structure includes tiltable or otherwise moveable reflective elements, the process can include adjusting the inclination angle of the reflective elements relative to the radiation path (step 620). Alternatively, for example, when the adaptive structure includes variably transmissive elements, the process can include adjusting the transmissivity of selected transmissive elements (step 622). In either embodiment, the process can further include replacing an initial microlithographic substrate with a subsequent microlithographic substrate after the adjustment (step 624), for example, to determine the effect of the adjustment.

One feature of the arrangements described above with reference to FIGS. 1–6C is that the adaptive structures can be easily altered by providing instructions from the controller 170. An advantage of this feature is that unlike conventional filters and pellicles, the structure that tailors the intensity of the radiation need not be removed from the system and replaced in order to produce a new intensity distribution. Accordingly, this arrangement can be less expensive than conventional arrangements because it requires fewer pieces of hardware. The arrangement can also be more efficient than conventional arrangements because it can take less time to change the intensity distribution of the radiation beam.

Another advantage of the arrangements described above with reference to FIGS. 1–6C is that they can be used to account for a wide range of factors that can systematically cause characteristics of the microelectronic or other microlithographic features to deviate from their target characteristics. For example, the adaptive structure can be adjusted to account for slight variations across a given mask and/or between different masks or reticles that are configured to produce the same illumination pattern on one or more microlithographic substrates, but that may fail to do so due to manufacturing tolerances or errors. Alternatively, the adaptive structure can be used to account for the degradation that can occur to a single mask and/or other system optics and/or the radiation source over the course of time. Still further, the adaptive structure can tailor the intensity distribution of the incident radiation beam to correspond to a variety of different masks having a wide variety of disparate aperture patterns. For example, the adaptive structure can have a first configuration when used with a first mask to form one type of microelectronic die or chip, and can be changed to a second configuration when used with a second mask to form a different type of microelectronic die or chip.

In other embodiments, the adaptive structure can be used to account for variations produced by other aspects of the process or processes for forming microelectronic devices or other microlithographic features. For example, if a particular section of the microlithographic substrate or microlithographic substrate field tends to etch more slowly than another (producing features that are undersized), the intensity of the radiation directed to this region can be increased. The increased radiation can locally increase the radiation dose and therefore the size of the features formed in that region. If one region of the microlithographic substrate has a non-uniform optical thickness as a result of prior material deposition and/or removal processes (such as CMP processes), this can alter the manner in which the radiation-sensitive material subsequently disposed on the microlithographic substrate behaves. For example, optically non-uniform regions may reflect incident radiation differently than uniform regions, which can change the amount of reflected radiation absorbed by the photoresist layer on the microlithographic substrate. The intensity distribution of the radiation directed toward this portion of the substrate can be altered to account for this non-uniformity, for example by increasing the incident radiation intensity where the radiation absorption is less than a target level, and/or decreasing the incident radiation intensity where the radiation absorption is greater than a target level.

From the foregoing, it will be appreciated that specific embodiments of the invention have been described herein for purposes of illustration, but that various modifications may be made without deviating from the spirit and scope of the invention. For example, in one embodiment, the apparatus can include both a deformable reflective medium and a variably transmissive medium to increase the degree of control over the intensity of the radiation exiting the adaptive structure. In another embodiment, any of the refractive elements described above, including the reticle, can be replaced with reflective elements that perform generally the same function. Accordingly, the invention is not limited except as by the appended claims.

What is claimed is:

1. A method for controlling an intensity distribution of radiation directed to a microlithographic substrate, comprising:

directing a radiation beam from a radiation source along a radiation path, the radiation beam having a first distribution of intensity as a function of location in a plane generally transverse to the radiation path;

impinging the radiation beam on an adaptive structure positioned in the radiation path;

changing an intensity distribution of the radiation beam from the first distribution to a second distribution different than the first distribution by changing a reflection angle of a first portion of the adaptive structure relative to a reflection angle of a second portion of the adaptive structure;

directing the radiation beam away from the adaptive structure along the radiation path;

passing the radiation beam directed away from the adaptive structure through a reticle positioned between the adaptive structure and the microlithographic substrate; and impinging the radiation beam on the microlithographic substrate.

2. The method of claim 1 wherein the adaptive structure includes a reflective surface having a first portion coupled to a first actuator and a second portion coupled to a second actuator, and wherein impinging the radiation beam includes impinging a first portion of the radiation beam on the first portion of the reflective surface and impinging a second portion of the radiation beam on the second portion of the reflective surface, and wherein changing a state of the first portion of the adaptive structure relative to a second portion of the adaptive structure includes moving the first portion of the reflective surface relative to the second portion of the reflective surface, and wherein the method further comprises:

reflecting at least part of the first portion of the radiation beam toward a portion of a grating having a first transmissivity and reflecting at least part of the second portion of the radiation beam toward a portion of the grating having a second transmissivity greater than the first transmissivity; and passing at least part of the second portion of the radiation beam through the grating to impinge on the microlithographic substrate.

3. The method of claim 1 wherein the microlithographic substrate is a first microlithographic substrate having a layer of radiation-sensitive material, and wherein the method further comprises:

passing the radiation beam with the second intensity distribution through a reticle and onto the radiation-sensitive material to form an image on the radiation sensitive material;

forming features in the first microlithographic substrate based on the image formed on the radiation sensitive material;

determining characteristics of the features formed in the first microlithographic substrate;

based on the determined characteristics, changing an intensity distribution of the radiation beam from the first distribution to a third distribution different than the first and second distributions by changing a state of at least one of the first and second portions of the adaptive structure; and impinging the radiation beam with the third intensity distribution on a second microlithographic substrate.

4. The method of claim 1 wherein the adaptive structure includes a selectively transmissive medium, and wherein changing a state of the first portion of the adaptive structure relative to the second portion includes changing a transmissivity of the first portion to be different than a transmissivity of the second portion.

5. The method of claim 1 wherein the adaptive structure includes a liquid crystal material, and wherein changing a state of the first portion of the adaptive structure relative to the second portion includes changing a transmissivity a first portion of the liquid crystal material relative to a transmissivity of a second portion of the liquid crystal material.

6. The method of claim 1, further comprising:

passing the radiation beam through a reticle positioned between the adaptive structure and the microlithographic substrate to form an image on the microlithographic substrate; and scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

7. The method of claim 1, further comprising:

passing the radiation beam through a reticle positioned between the adaptive structure and the microlithographic substrate to form an image on the microlithographic substrate; and stepping the microlithographic substrate and the reticle relative to each other by impinging the radiation on a first field of the microlithographic substrate while the microlithographic substrate is in a first fixed transverse alignment relative to the reticle, moving at least one of the reticle and the microlithographic substrate transversely relative to the other to align a second field with the reticle, and exposing the second field to the radiation while the microlithographic substrate is in a second fixed transverse alignment relative to the reticle.

8. The method of claim 1 wherein changing the intensity distribution of the radiation beam includes changing each portion of the second distribution by no more than about ten percent relative to the corresponding portion of the first distribution.

9. The method of claim 1 wherein changing the intensity distribution of the radiation beam includes changing each portion of the second distribution by no more than about five percent relative to the corresponding portion of the first distribution.

10. The method of claim 1 wherein impinging the radiation beam with the second intensity distribution on the microlithographic substrate includes irradiating a first portion of the microlithographic substrate with radiation at a first intensity and irradiating a second portion of the microlithographic substrate with radiation at a second intensity, the second portion of the microlithographic substrate being spaced apart from the first portion of the microlithographic substrate by a distance of about 0.3 millimeters or greater.

11. The method of claim 1 wherein the radiation beam has an average intensity after impinging on the adaptive structure, and wherein impinging the radiation beam on the microlithographic substrate includes impinging radiation with a higher than average intensity on a first field of the microlithographic substrate and impinging radiation with a lower than average intensity on a second field of the microlithographic substrate.

12. The method of claim 1 wherein the radiation beam has an average intensity after impinging on the adaptive structure, and wherein impinging the radiation beam on the microlithographic substrate includes impinging radiation with a higher than average intensity on a first die of the microlithographic substrate and impinging radiation with a lower than average intensity on a second die of the microlithographic substrate.

13. The method of claim 1, further comprising changing a shape of the radiation beam after impinging the radiation beam on the adaptive structure.

14. The method of claim 1 wherein impinging the radiation beam on the microlithographic substrate includes impinging the radiation beam on a photosensitive layer of the microlithographic substrate.

15. A method for controlling an intensity distribution of radiation directed to a microlithographic substrate, comprising:

directing a radiation beam from a radiation source along a radiation path toward a microlithographic substrate;

impinging a first portion of the radiation beam on a first portion of a selectively transmissive medium and impinging a second portion of the radiation beam on a second portion of the selectively transmissive medium;

changing a transmissivity of at least one of the first and second portions of the selectively transmissive medium relative to the other;

reflectively passing at least part of at least one of the first and second portions of the radiation beam through the selectively transmissive medium to impinge on the microlithographic substrate, while at least inhibiting passage of at least part of the other of the first and second portions of the radiation beam through the selectively transmissive medium;

directing the radiation beam away from the selectively transmissive medium along the radiation path and passing the radiation beam through a reticle positioned between the selectively transmissive medium and the microlithographic substrate; and impinging the radiation beam on the microlithographic substrate.

16. The method of claim 15 wherein the radiation beam has a first intensity distribution upon impinging on the selectively transmissive medium, and wherein the method further comprises changing an intensity distribution of the radiation beam directed away from the selectively transmissive medium to a second intensity distribution different than the first distribution by changing a transmissivity of at least one of the first and second portions of the selectively transmissive medium relative to the other.

17. The method of claim 15 wherein impinging the radiation on a selectively transmissive medium includes impinging the radiation on a liquid crystal material, and wherein changing a transmissivity includes changing the first portion of the selectively transmissive medium to be opaque.

18. The method of claim 15 wherein impinging the radiation on a selectively transmissive medium includes impinging the radiation on a liquid crystal material, and wherein changing a transmissivity includes reducing the transmissivity of the first portion of the selectively transmissive medium without making the first portion opaque.

19. The method of claim 15, further comprising selecting the radiation beam to have a wavelength of about 365 nanometers or less.

20. The method of claim 15 wherein impinging the radiation beam on the microlithographic substrate includes impinging the radiation beam on a radiation-sensitive material of the microlithographic substrate.

21. The method of claim 15 wherein impinging the radiation beam on the microlithographic substrate includes impinging the radiation beam on a photoresist layer of the microlithographic substrate.

22. A method for controlling an intensity distribution of radiation directed to a microlithographic substrate, comprising:
directing a radiation beam from a radiation source along a radiation path toward a microlithographic substrate;
impinging a first portion of the radiation beam on a first portion of a reflective medium and impinging a second portion of the radiation beam on a second portion of the reflective medium;
moving the first portion of the reflective medium relative to the second portion of the reflective medium;
reflecting at least part of the first portion of the radiation beam toward a first portion of a grating having a first transmissivity and reflecting at least part of the second portion of the radiation beam toward a second portion of the grating having a second transmissivity greater than the first transmissivity; and
passing at least part of the second portion of the radiation beam through the grating to impinge on the microlithographic substrate while attenuating and/or blocking at least part of the first portion of the radiation beam from passing through the grating.

23. The method of claim 22 wherein the radiation beam has a first intensity distribution upon impinging on the reflective medium, and wherein the method further comprises changing an intensity distribution of the radiation beam passing through the grating to a second intensity distribution different than the first distribution.

24. The method of claim 22 wherein the microlithographic substrate has a layer of radiation-sensitive material and wherein passing the radiation through the grating to impinge on the microlithographic substrate includes directing the first portion of the radiation to impinge on the radiation-sensitive material.

25. The method of claim 22, further comprising selecting the grating to have an open area of at least about 90 percent.

26. The method of claim 22 wherein moving the first portion of the reflective medium relative to the second portion of the reflective medium includes tilting a reflective surface of the first portion relative to the radiation path to an angle different than an angle between the radiation path and a reflective surface of the second portion.

27. The method of claim 22, further comprising absorbing radiation incident on the first portion of the grating with absorbent material on the opaque portion of the grating.

28. The method of claim 22, further comprising selecting the radiation beam to have a wavelength of about 365 nanometers or less.

29. A method for controlling intensity distributions of radiation directed to microlithographic substrates, comprising:
directing a radiation beam from a radiation source along a radiation path toward a first microlithographic substrate;
forming an image on a surface of the microlithographic substrate;
based on the image, forming a feature of the microlithographic substrate;
determining a difference between a characteristic of the feature and a target characteristic;
based on the difference between the characteristic of the feature and the target characteristic, determining a difference between an intensity distribution of radiation impinging on the first microlithographic substrate and a target intensity distribution;
at least partially reducing the difference between the intensity distribution and the target intensity distribution by positioning an adaptive structure in the radiation path and changing a reflection angle of a first portion of the adaptive structure relative to a reflection angle of a second portion of the adaptive structure to redirect at least part of the radiation; and
directing radiation from the radiation source along the radiation path to impinge on the adaptive structure and a second microlithographic substrate.

30. The method of claim 29 wherein forming an image on a surface of the microlithographic substrate includes forming an image on a radiation-sensitive material of the microlithographic substrate.

31. The method of claim 29 wherein forming a feature of the microlithographic substrate includes forming a conductive structure of the microlithographic substrate, and wherein determining a difference between a characteristic of the feature and a target characteristic includes determining a difference between a conductivity of the conductive structure and a target conductivity.

32. The method of claim 29 wherein determining a difference between a characteristic of the feature and a target characteristic includes determining a difference between a dimension of the feature and a target dimension.

33. The method of claim 29 wherein determining a difference between a characteristic of the feature and a target characteristic includes determining a difference in a characteristic of an etched feature.

34. The method of claim 29 wherein determining a difference between a characteristic of the feature and a target characteristic includes determining a difference caused by passing the radiation beam through a reticle.

35. The method of claim 29 wherein the adaptive structure includes a reflective surface having a first portion coupled to a first actuator and a second portion coupled to a second actuator, and wherein impinging the radiation beam includes impinging a first portion of the radiation beam on the first portion of the reflective surface and impinging a second portion of the radiation beam on the second portion of the radiation surface, and wherein changing a reflection angle of the first portion of the adaptive structure relative to a reflection angle of the second portion of the adaptive structure includes moving the first portion of the reflective surface relative to the second portion of the reflective surface, and wherein the method further comprises:
reflecting at least part of the first portion of the radiation beam toward a first portion of a grating having a first transmissivity and reflecting at least part of the second portion of the radiation beam toward a second portion of the grating having a second transmissivity greater than the first transmissivity; and
passing at least part of the second portion of the radiation beam through the grating to impinge on the microlithographic substrate.

36. The method of claim 29 wherein the adaptive structure includes a selectively transmissive medium, and wherein changing a reflection angle of the first portion of the adaptive structure relative to a reflection angle of the second portion includes changing a transmissivity of the first portion to be different than a transmissivity of the second portion.

37. The method of claim 29 wherein the adaptive structure includes a liquid crystal material, and wherein changing a reflection angle of the first portion of the adaptive structure relative to a reflection angle of the second portion includes changing a transmissivity a first portion of the liquid crystal material relative to a transmissivity of a second portion of the liquid crystal material.

38. The method of claim 29, further comprising:
passing the radiation beam through a reticle positioned between the adaptive structure and the microlithographic substrate to form an image on the microlithographic substrate; and
scanning the reticle and the microlithographic substrate relative to each other by moving the reticle along a reticle path generally normal to the radiation path proximate to the reticle and moving the microlithographic substrate along a substrate path in a direction opposite the reticle and generally normal to the radiation path.

39. The method of claim 29, further comprising:
passing the radiation beam through a reticle positioned between the adaptive structure and the microlithographic substrate to form an image on the microlithographic substrate; and
stepping the microlithographic substrate and the reticle relative to each other by impinging the radiation beam on a first field of the microlithographic substrate while the microlithographic substrate is in a first fixed transverse alignment relative to the reticle, moving at least one of the reticle and the microlithographic substrate transversely relative to the other to align a second field with the reticle, and exposing the second field to the radiation beam while the microlithographic substrate is in a second fixed transverse alignment relative to the reticle.

40. A method for controlling intensity distributions of radiation directed to microlithographic substrates, comprising:
directing a radiation beam from a radiation source along a radiation path toward a first microlithographic substrate;
forming an image on a surface of the microlithographic substrate;
based on the image, forming a feature of the microlithographic substrate;
determining a difference between a characteristic of the feature and a target characteristic;
based on the difference between the characteristic of the feature and the target characteristic, determining a difference between an intensity distribution of radiation impinging on the first microlithographic substrate and a target intensity distribution;
at least partially reducing the difference between the intensity distribution and the target intensity distribution by positioning an adaptive structure in the radiation path and changing a state of a first portion of the adaptive structure relative to a second portion of the adaptive structure to redirect at least part of the radiation; and
directing radiation from the radiation source along the radiation path to impinge on the adaptive structure and a second microlithographic substrate.

* * * * *